United States Patent [19]

Rush

[11] Patent Number: 4,894,566

[45] Date of Patent: Jan. 16, 1990

[54] NOISE REDUCTION CIRCUIT

[76] Inventor: Michael J. Rush, R.R. 1, Box 115, Owensburg, Ind. 47453

[21] Appl. No.: 259,123

[22] Filed: Oct. 18, 1988

[51] Int. Cl.$^4$ .............................................. H03K 5/08
[52] U.S. Cl. .................................. 307/542; 307/521; 307/565
[58] Field of Search ............... 307/540, 542, 543, 555, 307/559, 565, 567, 520, 521; 328/162, 165, 167

[56] References Cited

U.S. PATENT DOCUMENTS

| | | |
|---|---|---|
| Re. 27,202 | 10/1971 | Kahn . |
| 2,859,405 | 11/1958 | Feldman et al. . |
| 2,976,408 | 3/1961 | Colaguori . |
| 3,119,961 | 1/1964 | Ambrose . |
| 3,126,449 | 3/1964 | Shirman . |
| 3,278,866 | 10/1966 | Bose ..................................... 307/520 |
| 3,337,808 | 8/1967 | Kahn . |
| 3,585,311 | 6/1971 | Berkley et al. . |
| 3,673,343 | 6/1972 | Vosteen ............................... 307/520 |
| 3,818,362 | 6/1974 | van Sluys ............................ 328/167 |
| 3,846,719 | 11/1974 | Dolby . |
| 3,989,897 | 11/1976 | Carver . |
| 4,113,983 | 9/1978 | Steel . |
| 4,118,601 | 10/1978 | Yeap . |
| 4,135,590 | 1/1979 | Gaulder . |
| 4,169,993 | 10/1979 | Taylor et al. . |
| 4,185,168 | 1/1980 | Graupe et al. . |
| 4,198,596 | 4/1980 | Waeselynck et al. . |
| 4,207,543 | 6/1980 | Izakson et al. ...................... 328/167 |
| 4,208,548 | 6/1980 | Orban . |
| 4,249,042 | 2/1981 | Orban . |
| 4,263,554 | 4/1981 | Keane . |
| 4,339,829 | 7/1982 | Dimon . |
| 4,363,006 | 12/1982 | Ishigaki et al. . |
| 4,388,731 | 6/1983 | King . |
| 4,412,100 | 10/1983 | Orban . |
| 4,430,754 | 2/1984 | Ishigaki . |
| 4,649,785 | 3/1987 | Chapman . |

OTHER PUBLICATIONS

National Semiconductor, Linear Applications, vol. 1, AN10-2, (1968) p. AN10-2.
Lancaster, *Active Filter Cookbook*, 1979, pp. 93, 198–205.
Active Filter Cookbook, 1979, p. 93.

Primary Examiner—John Zazworsky
Attorney, Agent, or Firm—Barnes & Thornburg

[57] ABSTRACT

A noise reduction circuit includes a variable band-pass filter and a clipping circuit. An oscillator is used to sweep the band-pass of the variable band-pass filter through a frequency range. The output of the variable band-pass filter is coupled to the input of the clipping circuit.

12 Claims, 6 Drawing Sheets

NOISE REDUCTION CIRCUIT

This is a continuation-in-part of United States patent application Ser. No. 942,981 entitled "Noise Reduction Circuit," filed Dec. 15, 1986, now abandoned.

This invention relates to a circuit which is used to reduce electrical noise on an electrical signal.

There are many electronic devices which process analog signals. In many of these devices, it is an objective to produce an analog output signal from an analog input signal which is as free as possible from electronic noise. Examples of such devices are radios, televisions and audio amplifiers. The inventive circuit which is described herein will be described in the context of an audio amplifier. However, it should be understood that it has application in any electronic device in which it is desired to reduce electronic noise on an analog signal which is being processed.

Known techniques for reducing electronic noise on an analog signal involve the use of electronic filters. These filters can be high-pass filters, low-pass filters, band-pass filters or any combination thereof.

It is an object of this invention to provide an improved noise reduction circuit.

The noise reduction circuit of this invention includes a variable band-pass filter having an input to which an electrical signal is coupled. The electrical signal is illustratively a "noisy" one, that is, it has an undesired noise component superimposed thereon. Means are provided for repetitively varying the band-pass of the variable band-pass filter through a first frequency range. An output of the variable band-pass filter is coupled to a clipping circuit. The electrical signal produced at an output of the clipping circuit corresponds to the noisy electrical signal at the input of the variable band-pass filter but with the noise component of the noisy electrical signal reduced. Illustratively, the means for repetitively varying the band-pass of the variable band-pass filter through the first frequency range comprises an oscillator. The variable band-pass filter includes means responsive to the amplitude of the oscillator signal for determining the band-pass of the variable band-pass filter.

The noise reduction circuit of this invention can further include a variable low-pass filter coupled to the output of the clipping circuit. The break frequency of the variable low-pass filter is illustratively controlled by the same means which is used to repetitively vary the band-pass of the variable band-pass filter. The variable low-pass filter is used to reduce noise which is introduced by the clipping circuit.

Additional features and advantages of the invention will become apparent to those skilled in the art upon consideration of the following detailed description of a preferred embodiment exemplifying the best mode of carrying out the invention as presently perceived. The detailed description particularly refers to the accompanying figures in which.

Figure 1:
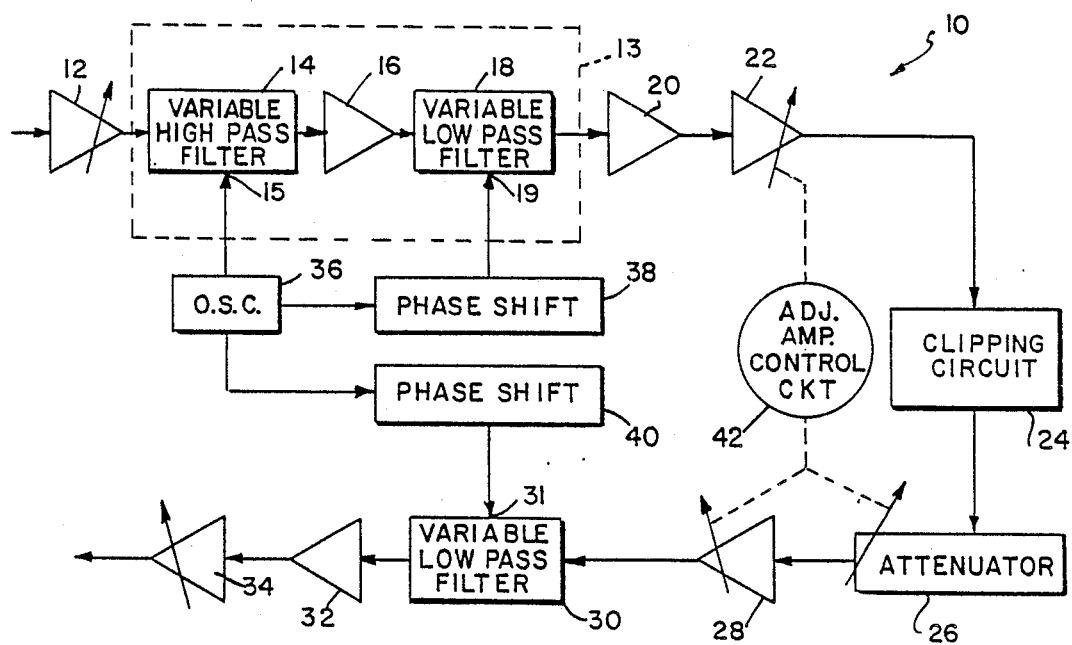
FIG. 1 is a block diagram of a noise reduction circuit in accordance with this invention.

Referring to FIG. 1, a noise reduction circuit 10 has at its input an adjustable amplifier 12. An output of adjustable amplifier 12 is coupled to an input of a variable band-pass filter 13. An output of variable band-pass filter 13 is coupled to an input of an amplifier 20.

An output of amplifier 20 is coupled to an input of an adjustable amplifier 22. An output of adjustable amplifier 22 is coupled to an input of a clipping circuit 24. An output of the clipping circuit 24 is coupled to an input of an attenuator 26. An output of attenuator 26 is coupled to an input of a variable amplifier 28. An output of variable amplifier 28 is coupled to an input of a variable low-pass filter 30. An output of variable low-pass filter 30 is coupled to an input of an amplifier 32. An output of amplifier 32 is coupled to an input of an adjustable amplifier 34. An output of adjustable amplifier 34 illustratively provides the output of noise reduction circuit 10.

Illustratively, variable band-pass filter 13 comprises a variable high-pass filter 14 coupled in series with a variable low-pass filter 18. In the illustrative embodiment, an input of variable high-pass filter 14 comprises the input for variable band-pass filter 13 and is coupled to the output of adjustable amplifier 12. An output of variable low-pass filter 18 illustratively comprises the output of variable band-pass filter 13 and is coupled to the input of amplifier 20. In the embodiment shown in FIG. 1, an amplifier 16 is connected between an output of variable high-pass filter 14 and an input of variable low-pass filter 18.

Amplifier 16 is a buffer amplifier which makes up for any losses introduced by variable high-pass filter 14. It should be understood, however, that the output of variable high-pass filter can be connected directly to the input of variable low-pass filter 18.

Variable high-pass filter 14 also has a break frequency adjusting input 15. Variable low-pass filter 18 also has a break frequency adjusting input 19. The break frequency adjusting input 15 of variable high-pass filter 14 is coupled to an output of an oscillator 36. An output of oscillator 36 is also coupled through a phase-shift circuit 38 to the break frequency adjusting input 19 of variable low-pass filter 18. An output of oscillator 36 is also coupled through a phase-shift circuit 40 to a break frequency adjusting input 31 of variable low-pass filter 30.

The gain of adjustable amplifiers 28 and 22 are illustratively controlled by an adjustable amplifier control circuit 42. The amount of attenuation provided by attenuator 26 can also illustratively be controlled by adjustable amplifier control circuit 42. Illustratively, adjustable amplifier control circuit 42 can comprise a potentiometer for each amplifier or attenuator to be controlled. The potentiometers could illustratively be ganged together. The potentiometer associated with a particular adjustable amplifier illustratively sets the gain of the adjustable amplifier and the potentiometer associated with the attenuator illustratively provides adjustable attenuation.

Referring to FIG. 1, the operation of noise reduction circuit 10 is described. An electrical signal having electrical noise thereon is coupled to the input of adjustable amplifier 12. Adjustable amplifier 12 scales the electrical signal at its input to produce an electrical signal which has an amplitude within the proper range for processing by the remainder of the circuit. Adjustable amplifier 12 can illustratively be an operational amplifier configured such that its gain is adjusted with a potentiometer.

The signal output from variable amplifier 12 is then filtered by variable band-pass filter 13. Oscillator 36 provides the means for repetitively varying the band-pass of variable band-pass filter 13 through a frequency range. Illustratively, oscillator 36 has a frequency in the range of 1 MHz to 10 MHz. It should be understood that oscillator 36 can have a frequency outside this range as long as it has a frequency sufficiently above the upper frequency limit of variable band-pass filter 13 to permit the electrical signal being filtered to be reconstructed in filtered form at the output of variable band-pass filter 13. It should be understood that when it is said that oscillator 36 varies the band-pass of variable band-pass filter 13 through the frequency range, it is meant that the center frequency of variable band-pass filter 13 is swept through the frequency range. Assuming that noise reduction circuit 10 is used for signals in the audio range, i.e., 10 Hz to 20 KHz, the center frequency of variable band-pass filter 13 would be swept from 10 Hz to 20 KHz.

As has been discussed, variable band-pass filter 13 is comprised of series connected variable high-pass filter 14 and variable low-pass filter 18. In order to vary the band-pass of variable band-pass filter 13 through the frequency range, variable high-pass filter 14 and variable low-pass filter 18 are configured such that the break frequency of variable low-pass filter 18 is greater than the break frequency of variable high-pass filter 14. Thus, the difference between the two break frequencies defines the band-pass of variable band-pass filter 13. Illustratively, this band-pass is maintained narrow enough so that no odd harmonic multiples of any frequency in the band are passed at any given instant in time.

In the embodiment shown in FIG. 1, the break frequencies of variable high-pass filter 14 and variable low-pass filter 18 are determined by the amplitude of the output signal or signals from oscillator 36 as will be discussed in more detail later. Since amplifier 16, if used, introduces some degree of phase-shift to the electrical signal being processed, phase-shift network 38 is interposed between an output of oscillator 36 and the break frequency adjusting input 19 of variable low-pass filter 18. Phase-shift circuit 38 is configured such that the amount it phase-shifts the output signal of oscillator 36 is identical to the amount amplifier 16 phase-shifts the output of variable high-pass filter 14. Thus, phase-shift circuit 38 compensates for the phase-shift introduced by amplifier 16.

Amplifier 20 is a buffer amplifier similar to amplifier 16. It compensates for any losses introduced by variable low-pass filter 18.

Adjustable amplifier 22 is used to set the amplitude of the electrical signal to the proper range for processing by clipping circuit 24. Adjustable amplifier 22 can be set to either amplify or reduce the amplitude of the signal coupled to its input from amplifier 20, depending upon the amplitude of that signal. This will become clearer as the operation of clipping circuit 24 is described.

Clipping circuit 24 coacts with variable band-pass filter 13 to provide an enhanced noise reduction circuit in accordance with this invention. Clipping circuit 24 illustratively clips 0.7 volts from the electrical signal. The gain of adjustable amplifier 22 is set so that the amplitude of the electrical signal coupled to the input of clipping circuit 24 will always be substantially greater than 0.7 volts when there is a desired audio component of the electrical signal present. When the amplitude of the electrical signal falls to 0.7 volts or less, it means that there is essentially only noise present. Since the gain of adjustable amplifier 22 is set such that the desired audio component of the electrical signal is always much greater than 0.7 volts, the only component which clipping circuit 24 eliminates by clipping 0.7 volts from the electrical signal is the noise component. Attenuator 26 attenuates the output of clipping circuit 24.

Adjustable amplifier 28 is used to compensate for adjustable amplifier 22. Illustratively, adjustable amplifiers 22 and 28 are configured such that their gains are the inverse of each other. In other words, if adjustable amplifier 22 is used to amplify an electrical signal, adjustable amplifier 28 would be used to compensate for the gain introduced by adjustable amplifier 22 such as by having a reduced gain.

Variable low-pass filter 30 reduces noise introduced by clipping circuit 24. Certain types of clipping circuits 24, which will be discussed in more detail later, introduce harmonics onto the electrical signal which are eliminated or greatly reduced by variable low-pass filter 30. Illustratively, variable low-pass filter 30 has its break frequency controlled by oscillator 36. The break frequency of variable low-pass filter 30 is swept through the frequency range of interest, illustratively 10–20 KHz if noise reducing circuit 10 is being used for audio frequencies. However, the frequency range through which variable low-pass filter 30 is swept may differ from the frequency range through which variable band-pass filter 13 is swept. For example, variable low-pass filter 30 would illustratively be configured so that its break frequency sweeps through the same range that the break frequency of variable low-pass filter 18 of variable band pass filter 13 sweeps. The break frequency of variable low-pass filter 18 will be always be above the center frequency of variable band-pass filter 13 at any given instant of time in order to provide the upper break frequency of variable band-pass filter 13. Phase-shift network 40 shifts the phase of the output signal from oscillator 36 so that the break frequency of variable low-pass filter 30 is set in proper relationship to the band-pass of variable band-pass filter 13.

Amplifier 32 is a buffer amplifier. It is used to compensate for any losses which have been introduced by variable low-pass filter 30.

Adjustable amplifier 34 provides the noise reduced output signal of noise reduction circuit 10. It Provides an electrical signal which has an amplitude range of the proper magnitude for further use, such as for driving speakers.

Figure 2:
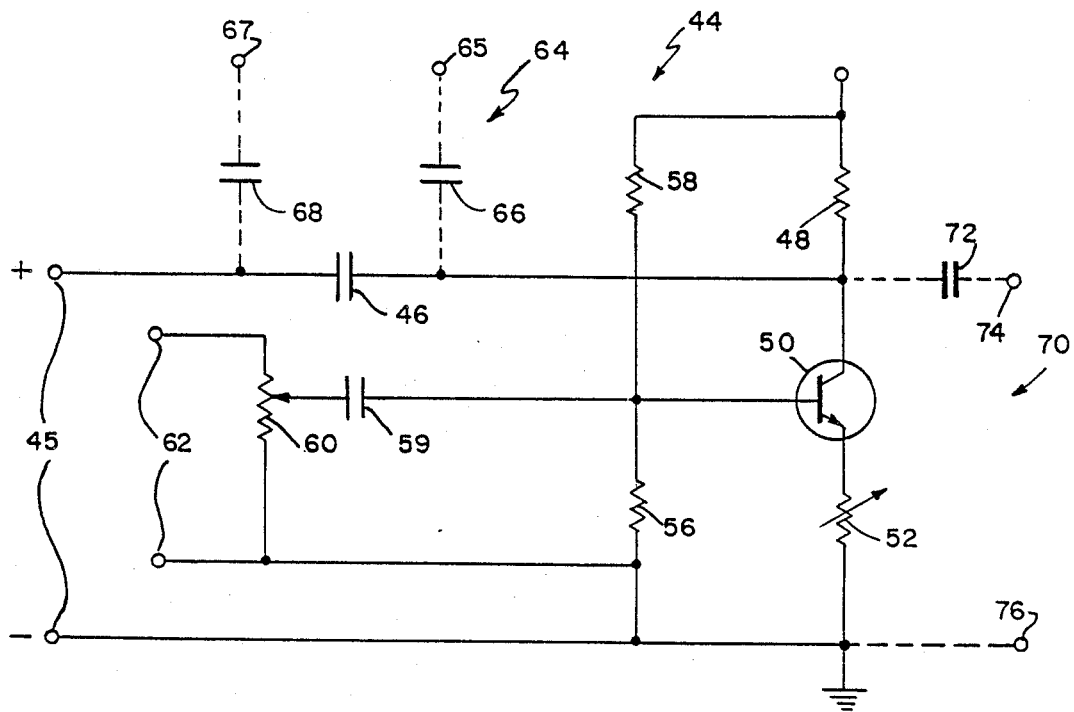
FIG. 2 is a schematic of a circuit for a variable filter.

FIG. 2 is a schematic of a circuit for a variable filter. As will become clear later, variable filter 44 can be configured to provide either variable high-pass filter 14 or variable low-pass filter 18.

Variable filter 44 includes a pair of input terminals 45. Illustratively, a negative terminal of input terminals 45 is connected to ground. A positive input terminal of input terminals 45 is coupled to a first terminal of capacitor 46. A second terminal of capacitor 46 is coupled to a first terminal of resistor 48 and to the collector of transistor 50. The emitter of transistor 50 is coupled through a variable resistor 52 to ground. The base of transistor 50 is coupled through resistor 56 to ground. The base of transistor 50 is also coupled through a resistor 58 to a source of DC power (not shown). The second terminal of resistor 48 is also coupled to the source of DC power.

The base of transistor 50 is also coupled through a capacitor 59 to the wiper of a potentiometer 60. Oscillator input terminals 62 are coupled to opposite terminals of potentiometer 60. The output signal of oscillator 36 is illustratively coupled to oscillator input terminals 62.

If variable filter 44 is to be used as a variable low-pass filter, a low-pass output 64, as shown by dashed lines, is provided. Low-pass output 64 includes low-pass output terminals 65, 67 and capacitors 66, 68. Low-pass output terminal 65 is coupled to a first terminal of capacitor 66 and low-pass output terminal 67 is coupled to a first terminal of capacitor 68. A second terminal of capacitor 66 is coupled to the collector of transistor 50 and a second terminal of capacitor 68 is coupled to the positive input terminal of input terminals 45.

If variable filter 44 is to be used as a variable high-pass filter, a high-pass output 70, as shown by dashed lines, is provided and low-pass output 64 is dispensed with. High-pass output 70 includes a capacitor 72 and high-pass output terminals 74, 76. High-pass output terminal 74 is coupled to a first terminal of capacitor 72. A second terminal of capacitor 72 is coupled to the collector of transistor 50. High-pass output terminal 76 is coupled to ground.

The operation of variable filter 44 is now described. Variable filter 44 is illustratively an RC filter. The break frequency of variable filter 44 is determined by the values of R and C in the circuit. Whether a high-pass break frequency is provided or a low-pass break frequency is provided depends on whether high-pass output 70 or low-pass output 64 is provided.

The variability of variable filter 44 is achieved by varying the R. The R of the RC network of variable filter 44 is comprised of transistor 50 and variable resistor 52. Variable resistor 52 is used for initial setup of variable filter 44 and is not used to vary the break frequency of variable filter 44 in operation. Varying the break frequency of variable filter 44 is achieved by biasing transistor 50 into varying states of conductivity. Transistor 50 has a resistance between its collector and emitter. This resistance is directly related to the state of conductivity of transistor 50. Thus, by varying transistor 50's state of conductivity, the R of the RC variable filter 44 is varied thus varying the break frequency of variable filter 44.

The state of conductivity of transistor 50 is determined by the amplitude of a signal at the base of transistor 50. As the amplitude of the signal at the base of transistor 50 increases, transistor 50 becomes more conductive. Thus, the resistance between the collector and emitter of transistor 50 decreases.

Oscillator 36 is used to bias transistor 50 into varying states of conductivity. Illustratively, the output signal of oscillator 36 is a sawtooth wave. Thus, transistor 50 will be gradually biased from a non-conducting state to a conducting state as the sawtooth signal rises. The resistance between the collector and emitter of transistor 50 gradually decreases in response to the rising signal. This, in turn, varies the break frequency of variable filter 44. Thus, the output signal from oscillator 36 sweeps variable filter through a frequency range. It should be understood that other waveforms can be generated by oscillator 36 such as sinusoids, triangular waves etc. and used to bias transistor 50 into varying states of conductivity.

Figure 3:
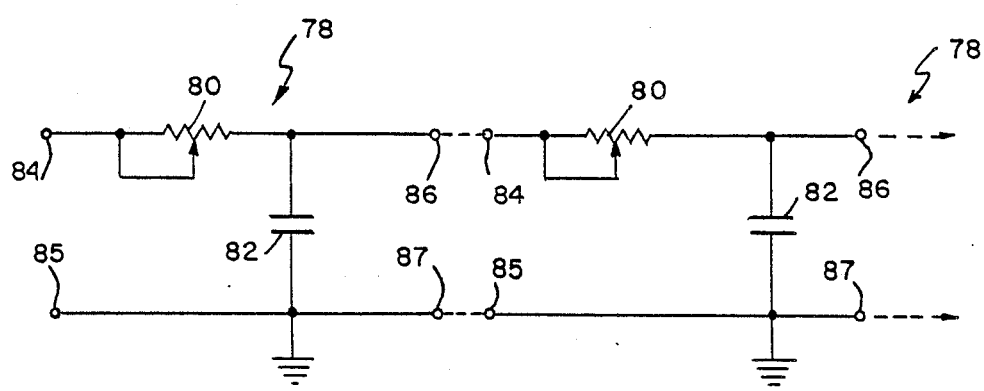
FIG. 3 is a schematic of a phase shift circuit.

FIG. 3 is a schematic of a phase-shift circuit which can be used for phase-shift circuits 38 and 40. Phase-shift circuit 78 includes input terminals 84, 85 and output terminals 86, 87. Illustratively, input terminal 85 is coupled to ground and input terminal 84 is coupled to one terminal of a potentiometer 80 and to the wiper of potentiometer 80. A second terminal of potentiometer 80 is coupled to an output terminal 86 and to a first terminal of capacitor 82. A second terminal of capacitor 82 is coupled to ground as is output terminal 87.

Depending upon the amount of phase-shift needed, a plurality of phase-shift circuits 78 can be connected in series by connecting the output terminals 86, 87 of one phase-shift circuit 78 to the input terminals 84, 85 of a second phase-shift circuit 78. FIG. 3 illustrates two phase-shift circuits 78 connected in series as shown by the dashed lines connecting the output terminals 86, 87 of the left-most phase-shift circuit 78 to the input terminals 84, 85 of the right-most phase-shift circuit 78.

Figures 4, 5:
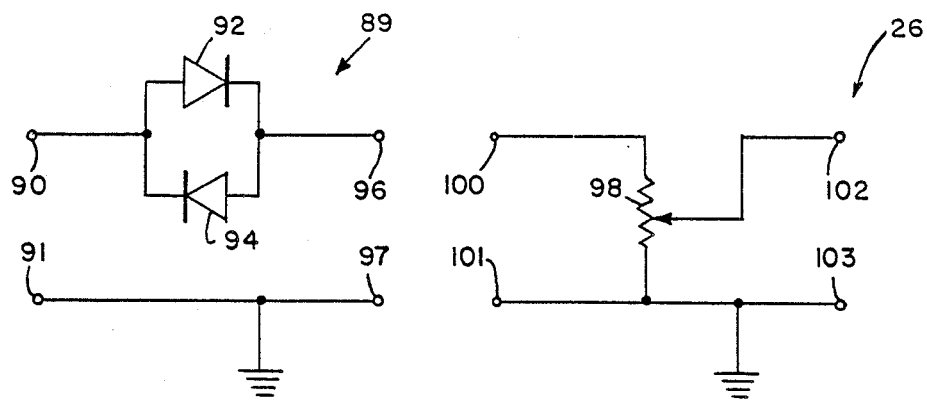
FIG. 4 is a schematic of a diode clipping circuit which can be used as the clipping circuit.
FIG. 5 is a schematic of an attenuator circuit.

FIG. 4 is a schematic of a diode clipping circuit 89 which can be used as clipping circuit 24. The diode clipping circuit 89 comprises back-to-back parallel connected diodes 92, 94 connected in series between an input terminal 90 and an output terminal 96. A second input terminal 91 and a second output terminal 97 are coupled to ground. Input terminal 90 is coupled to the anode of diode 92 and to the cathode of diode 94. The cathode of diode 92 and the anode of diode 94 are coupled to output terminal 96. It should be understood that a plurality of back-to-back connected diodes 92, 96 can be connected in parallel and the parallel combination connected in series between input terminal 90 and output terminal 96 to provide increased power handling capability.

FIG. 5 is a schematic of a circuit for attenuator 26. Attenuator 26 illustratively comprises a potentiometer 98, input terminals 100, 101 and output terminals 102, 103. Input terminal 101 and output terminal 103 are connected to ground. Output terminal 102 is connected to the wiper of potentiometer 98. One terminal of potentiometer 98 is coupled to ground and a second terminal of potentiometer 98 is coupled to input terminal 100.

Figure 6:
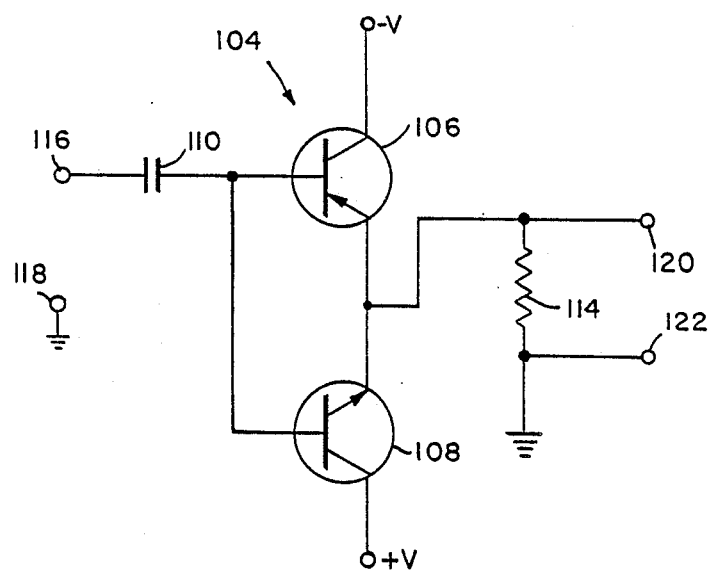
FIG. 6 is a schematic of a push-pull amplifier circuit which can be used as the clipping circuit.

FIG. 6 shows a Push-pull amplifier circuit 104 configured for use as the clipping circuit 24. The push-pull amplifier circuit 104 includes a PNP transistor 106, an NPN transistor 108, a capacitor 110, and a resistor 114. Push-pull amplifier circuit 104 also includes input terminals 116, 118, and output terminals 120, 122. Input terminal 116 is coupled through capacitor 110 to the bases of transistors 106, 108. The emitters of transistors 106, 108 are coupled together and to output terminal 120. Resistor 114 is coupled across output terminals 120, 122, and output terminal 122 is coupled to ground. The collector of transistor 106 is coupled to a source of −VDC (not shown) and the collector of transistor 108 is coupled to a source of +VDC (not shown). Input terminal 118 is coupled to ground. Due to the P-N junctions of transistors 106, 108, push-pull amplifier circuit 104 will produce an output very similar to the output produced by the diode clipping circuit shown in FIG. 4.

Figure 7:
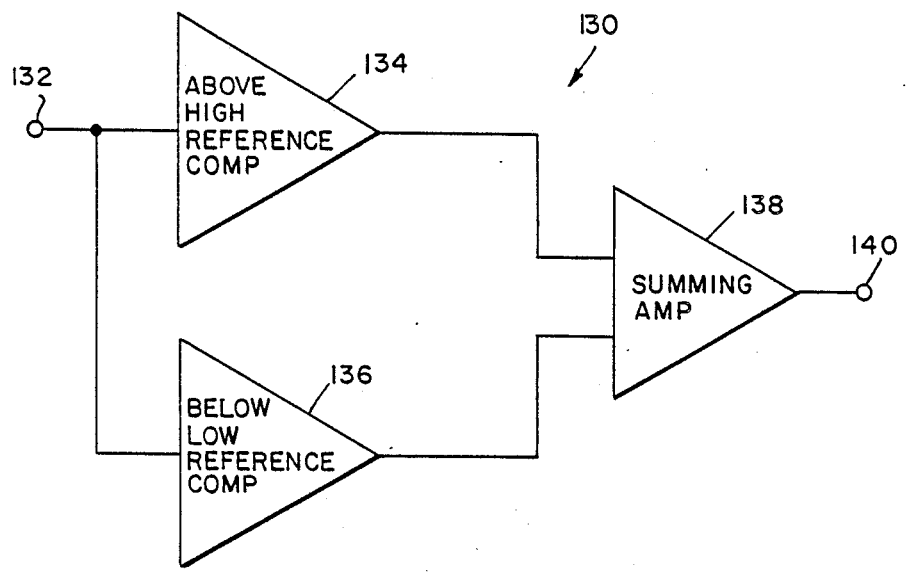
FIG. 7 is a block diagram of a threshold comparator circuit which can be used as the clipping circuit.

FIG. 7 is a block diagram of a threshold comparator circuit 130 which can be used as clipping circuit 24. Threshold comparator circuit 130 includes an input terminal 132, an above high reference comparator 134, a below low reference comparator 136, a summing amplifier 138, and an output terminal 140. Input terminal 132 is coupled to an input of above high reference comparator 134 and to an input of below low reference comparator 136. An output of above high reference comparator 134 is coupled to a first input of summing amplifier 138 and an output of below low reference comparator 136 is coupled to a second input of summing amplifier 138. An output of summing amplifier 140 is coupled to output terminal 140.

Figure 8:
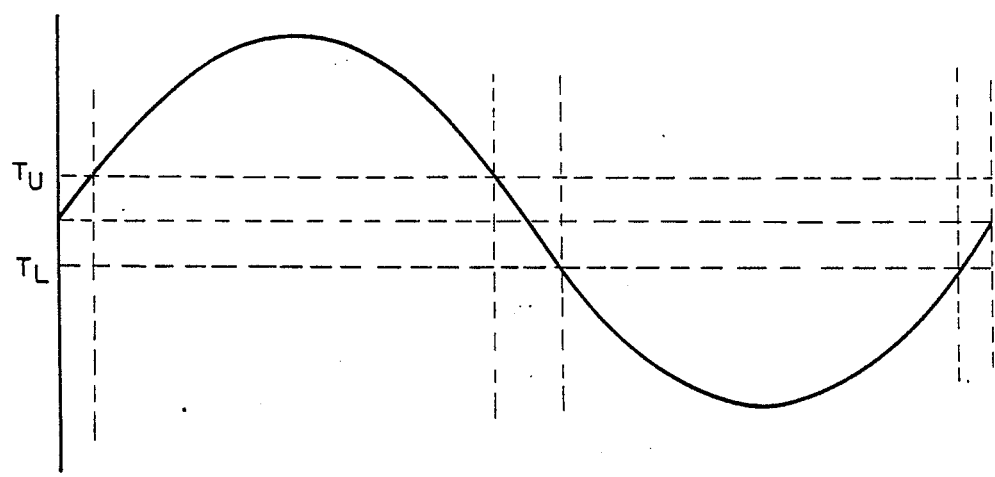
FIG. 8 is a graph of an input signal to the threshold comparator circuit of FIG. 7.
Figure 9:
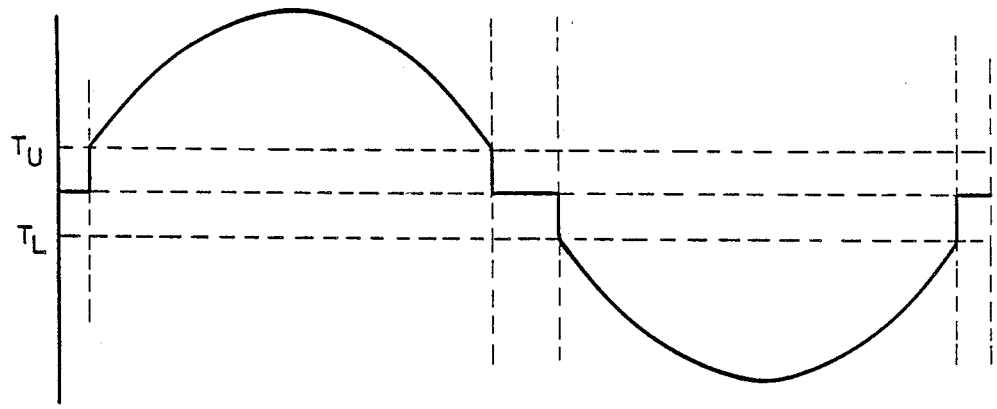
FIG. 9 is a graph of an output signal of the threshold comparator circuit of FIG. 7.

Referring to FIGS. 7-9, the operation of threshold comparator circuit 130 is described. FIG. 8 shows an input signal at input terminal 132 of threshold comparator circuit 130 and FIG. 9 shows an output signal at output terminal 140 of threshold comparator circuit 130. FIG. 8 is drawn above FIG. 9 with the same time scale as FIG. 8 so that the relationship between the input and output signals can be seen. Above high reference comparator 134 clips off that portion of the input signal which falls below a high reference ($T_U$) $T_U$ can either be preset or adjustable such as by a potentiometer. Below low reference comparator 136 clips off that portion of the input signal which falls above a low reference ($T_L$). Again, $T_L$ can either be preset or adjustable such as by a potentiometer. Summing amplifier 138 combines the output signals from comparators 134, 136 to produce the output signal for threshold comparator circuit 130 at output terminal 140. The high and low references are selected so that when the magnitude of the input signal falls below a certain magnitude, i.e., between $T_U$ and $T_L$, it is clipped with the resulting output signal shown in FIG. 9.

Figure 10:
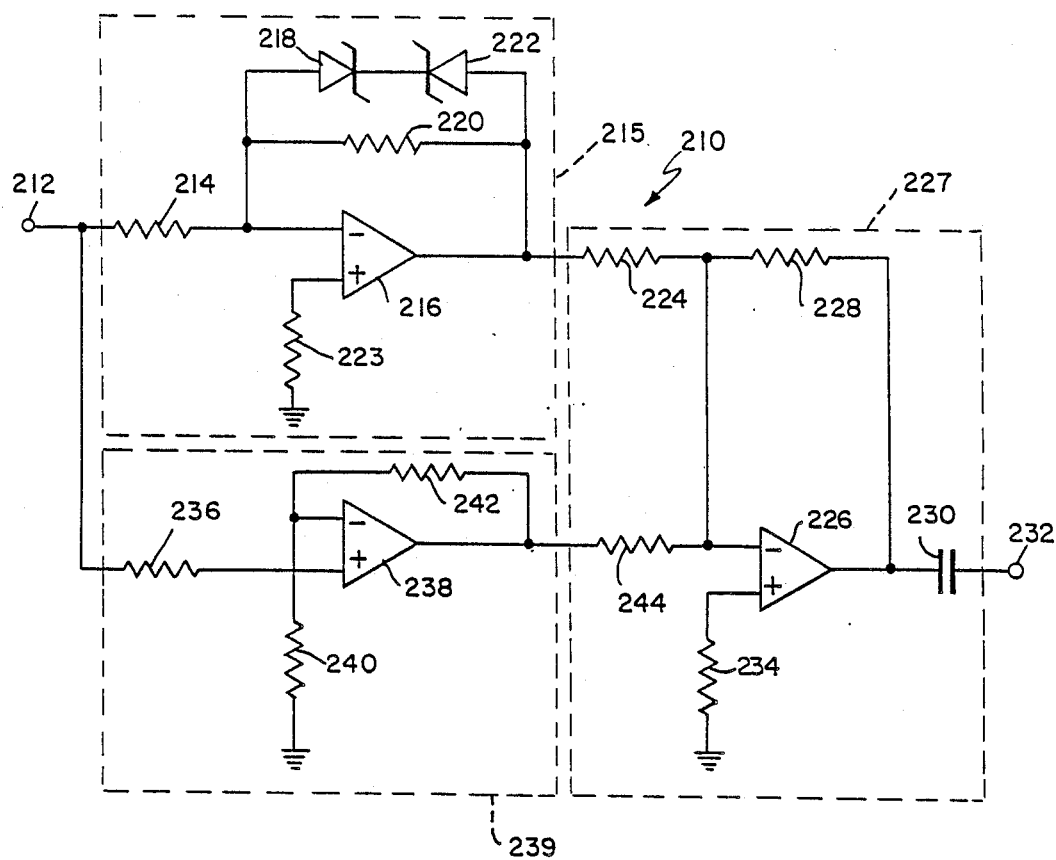
FIG. 10 is a schematic of a Zener clipping circuit which can be used as the clipping circuit.

FIG. 10 shows a zener clipping circuit 210 which can be used as clipping circuit 24. Zener clipping circuit 210 includes an input terminal 212 which is coupled through a resistor 214 of an inverting, clipping amplifier circuit 215 to the negative input of an operational amplifier 216 of inverting, clipping amplifier circuit 215. Inverting, clipping amplifier circuit 215 also includes zener diodes 218, 222, and resistors 220, 223. The negative input of operational amplifier 216 is coupled through feedback resistor 220 to the output of operational amplifier 216 and to the anode of zener diode 218. The cathode of zener diode 218 is coupled to the cathode of zener diode 222 and the anode of zener diode 222 is coupled to the output of operational amplifier 216. The positive input of operational amplifier 216 is coupled through resistor 223 to ground. The output of operational amplifier 216 is coupled through a resistor 224 of a summing amplifier circuit 227 to the negative input of an operational amplifier 226 of summing amplifier circuit 227.

Summing amplifier circuit 227 also includes resistors 228, 234, 244, and capacitor 230. The negative input of operational amplifier 226 is coupled to one terminal of resistor 244 and through feedback resistor 228 to the output of operational amplifier 226. The positive input of operational amplifier 226 is coupled through resistor 234 to ground. The output of operational amplifier 226 is coupled through capacitor 230 to an output terminal 232 of zener clipping circuit 210.

Input terminal 212 of zener clipping circuit 210 is also coupled through a resistor 236 of a non-inverting amplifier circuit 239 to the positive input of an operational amplifier 238 of non-inverting amplifier circuit 239. Non-inverting amplifier circuit 239 also includes resistors 240 and 242. The negative input of operational amplifier 238 is coupled through resistor 240 to ground and through feedback resistor 242 to the output of operational amplifier 238. The output of operational amplifier 238 is coupled to a second terminal of resistor 244 of summing amplifier circuit 227.

Figure 11:
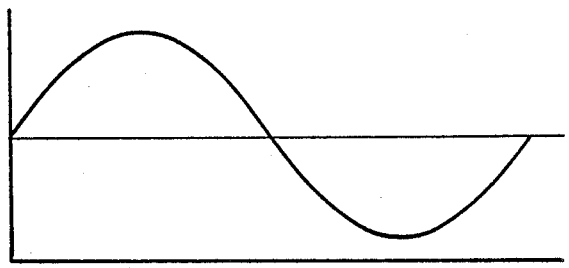
FIG. 11 is a graph of an input signal to the Zener clipping circuit of FIG. 10.
Figure 12:
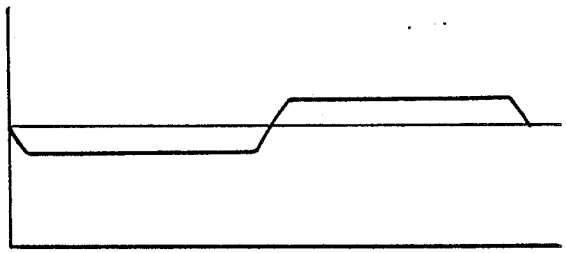
FIG. 12 is a graph of an output signal of an inverting clipping amplifier circuit of the Zener clipping circuit of FIG. 10.
Figure 13:
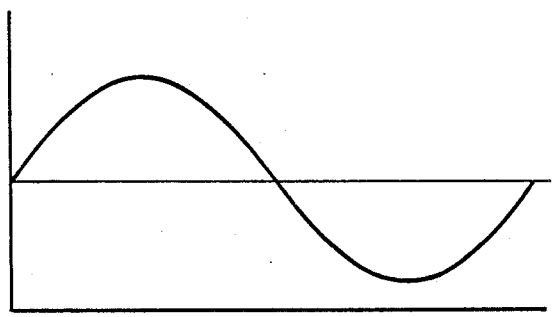
FIG. 13 is a graph of an output signal of a non-inverting amplifier circuit of the Zener clipping circuit of FIG. 10.
Figure 14:
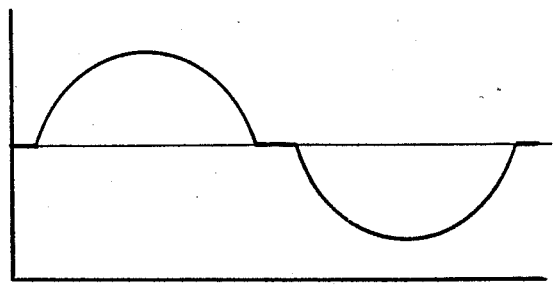
FIG. 14 is a graph of an output signal of the Zener clipping circuit of FIG. 10.

Referring to FIGS. 10-14, the operation of zener clipping circuit 210 is described. FIG. 11 shows an input signal at input terminal 212 of zener clipping circuit 210. FIG. 12 shows the output of inverting, clipping amplifier circuit 215. FIG. 13 shows the output of non-inverting amplifier circuit 239. FIG. 14 shows the output of summing amplifier circuit 227 which is also the output of zener clipping circuit 210 at output terminal 232.

Inverting, clipping amplifier circuit 215 inverts the input signal and clips that portion which exceeds a certain magnitude which is determined by the voltage drops across zener diodes 218, 222 to produce an output signal as shown in FIG. 12. Assuming that zener diodes 218, 222 are both 1 volt zener diodes, the output of operational amplifier 216 will be limited to 1.7 volts. Therefore, inverting, clipping amplifier circuit 215 in essence clips that portion of the input signal which exceeds 1.7 volts assuming that operational amplifier 216 is configured with a gain of one. Non-inverting amplifier circuit 239 buffers the input signal to compensate for any gains or losses of inverting, amplifier clipping circuit 215 and produces an output signal as shown in FIG. 13. Summing amplifier circuit 227 combines the outputs of inverting, clipping amplifier circuit 215 and non-inverting amplifier circuit 239 and produces the output signal shown in FIG. 14.

It should be understood that diode clipping circuit 89, push-pull amplifier circuit 104, threshold comparator circuit 130 and zener clipping circuit 210 are illustrative of circuits which can be used as clipping circuit 24. Clipping circuit 24 is not limited to these circuits and can be any circuit which clips that portion of a signal which falls below a certain magnitude.

Although the invention has been described in detail with reference to certain perferred embodiments and specific examples, variations and modifications exist within the scope and spirit of the invention as described and as defined in the following claims.

What is claimed is:

1. A circuit for reducing noise on an electrical signal, comprising a variable band-pass filter having an input to which the noisy electrical signal is coupled, means for repetitively varying the band-pass of the variable band-pass filter through a first frequency range, means for coupling the varying means to the variable band-pass filter, a clipping circuit, means for coupling an output of the variable band-pass filter to an input of the clipping circuit, and the clipping circuit having an output at which a noise reduced electrical signal is produced.

2. The circuit of claim 1 wherein the varying means includes an oscillator, means for coupling an output of the oscillator to a band-pass determining input of the variable band-pass filter, and the variable band-pass filter includes means responsive to an oscillator signal provided at the output of the oscillator for determining the band-pass of the variable band-pass filter to sweep the band-pass of the variable band-pass filter through the first frequency range.

3. The circuit of claim 2 wherein the means responsive to the oscillator signal for determining the band-pass of the variable band-pass filter comprises a variable impedance having an impedance determined by a characteristic of the oscillator output signal, the band-pass of the variable band-pass filter determined by the impedance of the variable impedance.

4. The circuit of claim 3 wherein the variable impedance comprises a semiconductor device capable of being biased into varying states of conductivity and having first and second terminals and a gate, the semiconductor device having an impedance between its first and second terminals determined by its state of conductivity, said state of conductivity determined by a bias signal applied to the gate of the semiconductor device, and means for coupling the gate of the semiconductor device to the output of the oscillator.

5. The circuit of claim 1 and further including a variable filter having an input, means for coupling the input of the variable filter to the output of the clipping circuit, means for varying a filtering characteristic of the variable filter through a range, and means for coupling the filtering characteristic varying means to the variable filter, the noise reduced electrical signal being produced at an output of the variable filter.

6. The circuit of claim 5 wherein the variable filter comprises a variable low-pass filter and the means for varying the filter characteristic comprises means for varying a break frequency of the variable low-pass filter, the means for varying the break frequency comprises the oscillator, means for coupling the output of the oscillator to a break frequency determining input of the variable low-pass filter, the variable low-pass filter including means responsive to the oscillator signal for sweeping the break frequency of the variable low-pass filter through a second frequency range.

7. The circuit of claim 1 wherein the variable band-pass filter comprises a variable high-pass filter connected in series with a variable low-pass filter and the means for varying the band-pass of the variable band-pass filter comprises means for varying a break frequency of the variable high-pass filter and a break frequency of the variable low-pass filter.

8. The circuit of claim 7 wherein the variable high- and low-pass filters each include a transistor having a base, collector and emitter, each transistor capable of being biased into varying states of conductivity and having an impedance between its emitter and collector determined by the state of conductivity of that transistor, the break frequencies of the variable high- and low-pass filters determined by the impedances of the respective transistors of the variable high- and low-pass filters, the means for varying the break frequencies of the high- and low-pass filters including an oscillator for producing an oscillator signal, means for coupling the oscillator signal to the base of the transistor of the variable high-pass filter to repetitively bias that transistor through a conductivity range, and means for coupling the oscillator signal to the base of the transistor of the variable low-pass filter to repetitively bias that transistor through a conductivity range.

9. The circuit of claim 8 wherein the impedance of the transistors of the variable high- and low-pass filters comprise resistances the magnitude of which are determined by the states of conductivity of their respective transistors.

10. The circuit of claim 1 wherein the clipping circuit comprises a diode clipping circuit.

11. The circuit of claim 4 wherein the clipping circuit comprises a diode clipping circuit.

12. A circuit for reducing electrical noise superimposed upon an electrical signal, comprising
    a variable band-pass filter having a transistor capable of being biased into various states of conductivity in response to the magnitude of a bias signal at a base of the transistor, the transistor having a resistance between a collector and an emitter the magnitude of which is determined by the transistor's state of conductivity;
    means for generating a periodic bias signal having a time varying magnitude;
    means for coupling the periodic bias signal to the base of the transistor to repetitively vary the collector-emitter resistance of the transistor to repetitively vary the band-pass of the variable band-pass filter over a frequency range;
    a diode clipping circuit;
    means for coupling an output of the variable band-pass filter to an input of the diode clipping circuit;
    a variable low-pass filter having a break frequency determined by the magnitude of a variable resistance, the variable low-pass filter including a transistor capable of being biased into various states of conductivity in response to a bias signal applied at a base of the variable low-pass filter transistor and having a resistance between a collector and an emitter the magnitude of which is determined by the state of conductivity of the variable low-pass filter transistor the collector-emitter resistance of the variable low-pass filter transistor comprising the variable resistance of the variable low-pass filter;
    means for coupling the periodic bias signal to the base of the variable low-pass filter transistor;
    means for coupling an output of the diode clipping circuit to an input of the variable low-pass filter, the variable low-pass filter having an output at which the noise reduced signal is produced.

* * * * *